United States Patent
Katchmart

(10) Patent No.: US 7,237,164 B1
(45) Date of Patent: Jun. 26, 2007

(54) AREA OPTIMIZED EDGE-TRIGGERED FLIP-FLOP FOR HIGH-SPEED MEMORY DOMINATED DESIGN

(75) Inventor: Supaket Katchmart, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 193 days.

(21) Appl. No.: 10/996,161

(22) Filed: Nov. 23, 2004

Related U.S. Application Data

(60) Provisional application No. 60/563,294, filed on Apr. 15, 2004.

(51) Int. Cl.
*G01R 31/28* (2006.01)
(52) U.S. Cl. .................... 714/726; 714/724; 327/202
(58) Field of Classification Search .................. None
See application file for complete search history.

(56) References Cited

U.S. PATENT DOCUMENTS 5,378,934 A * 1/1995 Takahashi et al. .......... 327/203
5,656,962 A * 8/1997 Banik ..................... 327/202
5,784,384 A * 7/1998 Maeno ..................... 714/726
5,920,575 A * 7/1999 Gregor et al. ............. 714/726
6,289,477 B1 * 9/2001 Gunadisastra ............. 714/724
2004/0088659 A1 * 5/2004 Mori ........................ 716/2

OTHER PUBLICATIONS

Nikolic, B., "EE241—Spring 2000, Advanced Digital Integrated Circuits, Lecture 23: Sequential Logic Latches and Flip-Flops," UC Berkley, pp. 1-25.

* cited by examiner

*Primary Examiner*—Albert Decady
*Assistant Examiner*—John P. Trimmings

(57) ABSTRACT

An area optimized edge-triggered flip-flop for high-speed memory dominated design is provided. The area optimized flip-flop also provides a bypass mode. The bypass mode allows the area optimized flip-flops to act like a buffer. This allows the area optimized flip-flop to provide the basic functionality of a flip-flop during standard operation, but also allows the area optimized flip-flop to act like a buffer when desirable, such as during modes of testing of the design. The area optimized flip-flop provides most of the functionality of a typical flip-flop, while reducing the total area and power consumption of the design.

53 Claims, 9 Drawing Sheets

AREA OPTIMIZED EDGE-TRIGGERED FLIP-FLOP FOR HIGH-SPEED MEMORY DOMINATED DESIGN

This application claims the benefit of provisional application 60/563,294 filed Apr. 15, 2004, which is hereby incorporated by reference herein in its entirety.

BACKGROUND OF THE INVENTION

This invention relates to high-speed, register dominated integrated circuit designs. More particularly, this invention relates to an area optimized flip-flop for reducing the total area of the integrated circuit design.

In high-speed, register dominated integrated circuit designs, flip-flops make up a significant portion of the total design area. Thus, optimizing or reducing the area of flip-flops in these designs, may significantly improve the designs by reducing their total area and power consumption.

Other reduced area flip-flops have been proposed, but many of these reduced area flip-flops limit the testability of integrated circuit designs. For example, scan chain testing is one commonly used test technique. A group of flip-flops within an integrated circuit design may be interconnected to form a scan chain. Multiplexers may be used at the input of these flip-flops to alternatively receive ordinary inputs or scan chain inputs. When a scan chain is formed with a group of flip-flops, a test pattern or vector may be shifted into the scan chain. After the test vector is shifted into the scan chain, the test vector may be allowed to propagate through select sequential and combinatorial elements of the design. The result may be shifted out of the chip through the same or a different scan chain and may be analyzed to detect errors in a chip fabricated from the design. The scan chain test is only one example of a design-for-test (DFT) technique, whereby an integrated circuit may be designed specifically to facilitate future testing of the finished chip.

In view of the forgoing, it would be desirable to be able to provide an area optimized edge-triggered flip-flop for high speed memory dominated designs that can reduce the total area of the design without significantly limiting the testability of the design. In particular, it would be desirable to provide an area optimized edge-triggered flip-flop for high speed memory dominated design that may be used in conjunction with a scan chain test.

SUMMARY OF THE INVENTION

In accordance with the invention, an area optimized edge-triggered flip-flop for high-speed memory dominated design is provided. According to one embodiment of the invention, typical edge-triggered flip-flops may be replaced with area optimized flip-flops. The area optimized flip-flops may occupy a significantly reduced area as compared to typical scan flip-flops.

In accordance with the invention, an area optimized flip-flop may provide a bypass mode in addition to a standard operating mode. In the standard operating mode, the area optimized flip-flop may behave like a typical flip-flop. However, in the bypass mode, the area-optimized flip-flop may behave like a buffer. The bypass mode may be used, for example, during test operations when low-speed test signals are propagated through areas of the circuit to test at least some aspects of circuit functionality. In bypass mode, the area optimized flip-flop design may pass signals like a buffer, independent of absent or low-speed clock signals.

Further features of the invention, its nature and various advantages, will be more apparent from the accompanying drawings and the following detailed description of the preferred embodiments.

DETAILED DESCRIPTION

Figure 1:
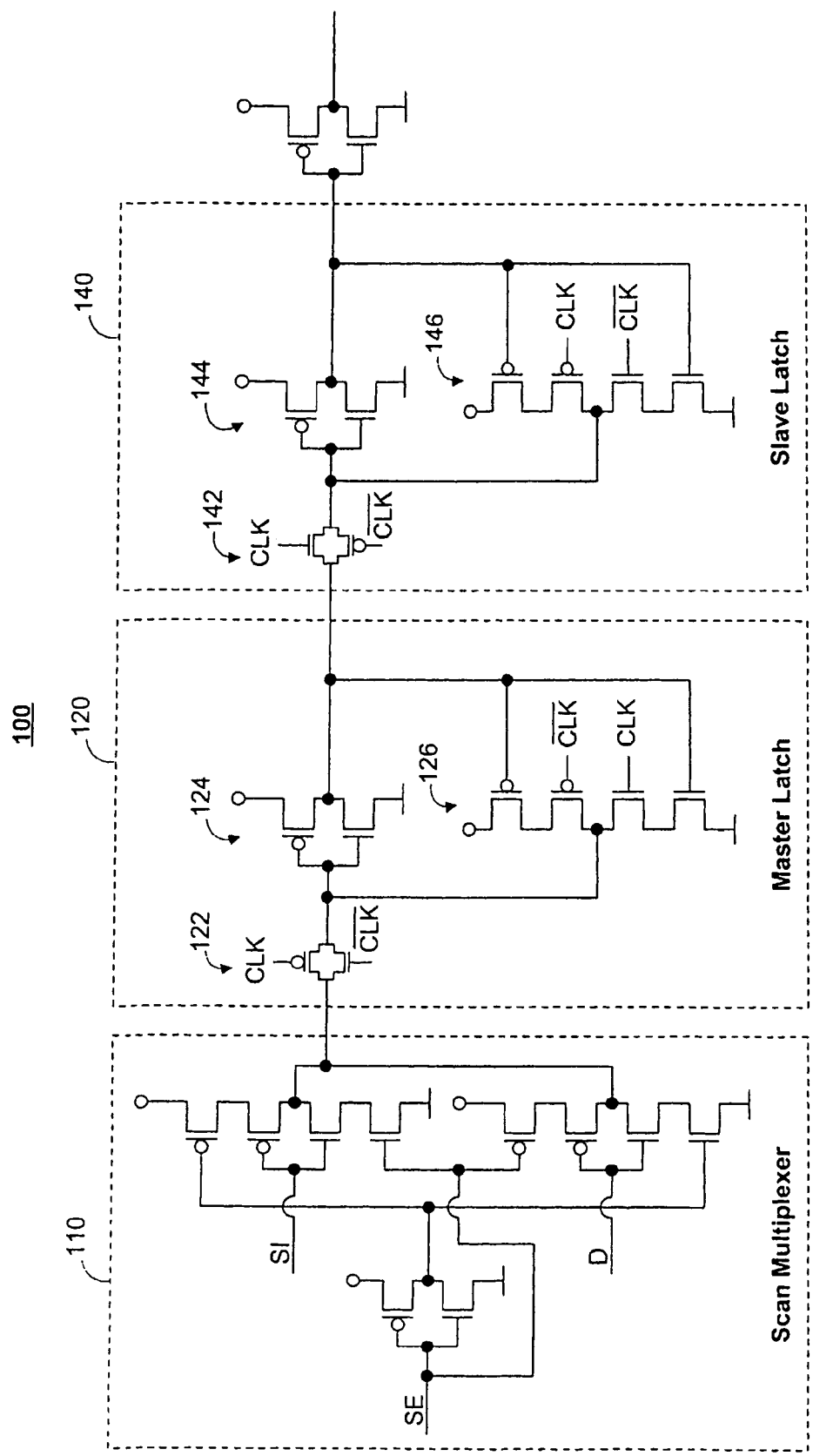
FIG. 1 is a simplified schematic of a typical scan flip-flop.

FIG. 1 shows a simplified schematic of a typical scan flip-flop 100. Scan flip-flop 100 is made up of latch circuits 120 and 140, connected in a master-slave configuration, and multiplexer 110.

Master latch 120 receives and stores an input signal when the clock signal CLK is at a LOW logic state. While CLK remains at a LOW logic state, passgate 122 is enabled and feedback inverter 126 is disabled, propagating the input of master latch 120 through inverter 124 to the output of master latch 120. When clock signal CLK is at a HIGH logic state, passgate 122 is disabled and feedback inverter 126 is enabled. This cuts-off the input to master latch 120, while preserving the output value of master latch 120.

Slave latch 140 operates in a similar manner as master latch 120, except with reversed clock inputs. When clock signal CLK is at a HIGH logic state, the input to slave latch 140 is propagated through passgate 142 and inverter 144 to the output of slave latch 140. However, when clock signal CLK is in a LOW logic state, the input to slave latch 140 is cutoff and the output value of the latch is preserved in the inversion loop of inverter 144 and tri-state inverter 146.

When master latch 120 and slave latch 140 are connected in series, as shown in FIG. 1, a rising edge-triggered master-slave flip-flop is formed. An input signal received by master latch 120 during the LOW logic state of the clock signal is propagated through slave latch 140 to the output of the flip-flop during the transition to a HIGH logic state.

Both master latch 120 and slave latch 140 contain tri-state inverters 126 and 146 which are connected in a feedback loop with inverters 124 and 144. Feedback inverters 126 and 146 allow latches 120 and 140 to retain their stored values when the clock signal is disabled or not operating at a frequency fast enough to continuously refresh latches 120 and 140 with new input signals.

At the input of scan flip-flop 100 is multiplexer 110. Multiplexer 110 is present at the input of scan flip-flop 100 to allow a group of scan flip-flops 100 to be connected together to form a scan chain to perform a scan chain test on a chip fabricated from a design. When the scan enable (SE)

signal is inactive, scan flip-flop 100 receives its usual input signal, D. However, when SE is active, scan flip-flop 100 receives scan input (SI), thereby connecting scan flip-flop 100 as part of the scan chain. Multiplexer 110 allows interconnections to be made between a group of scan flip-flops 100 to form a scan chain. These interconnections are used during a scan chain test and are not ordinarily utilized during normal circuit operation.

Figure 2:
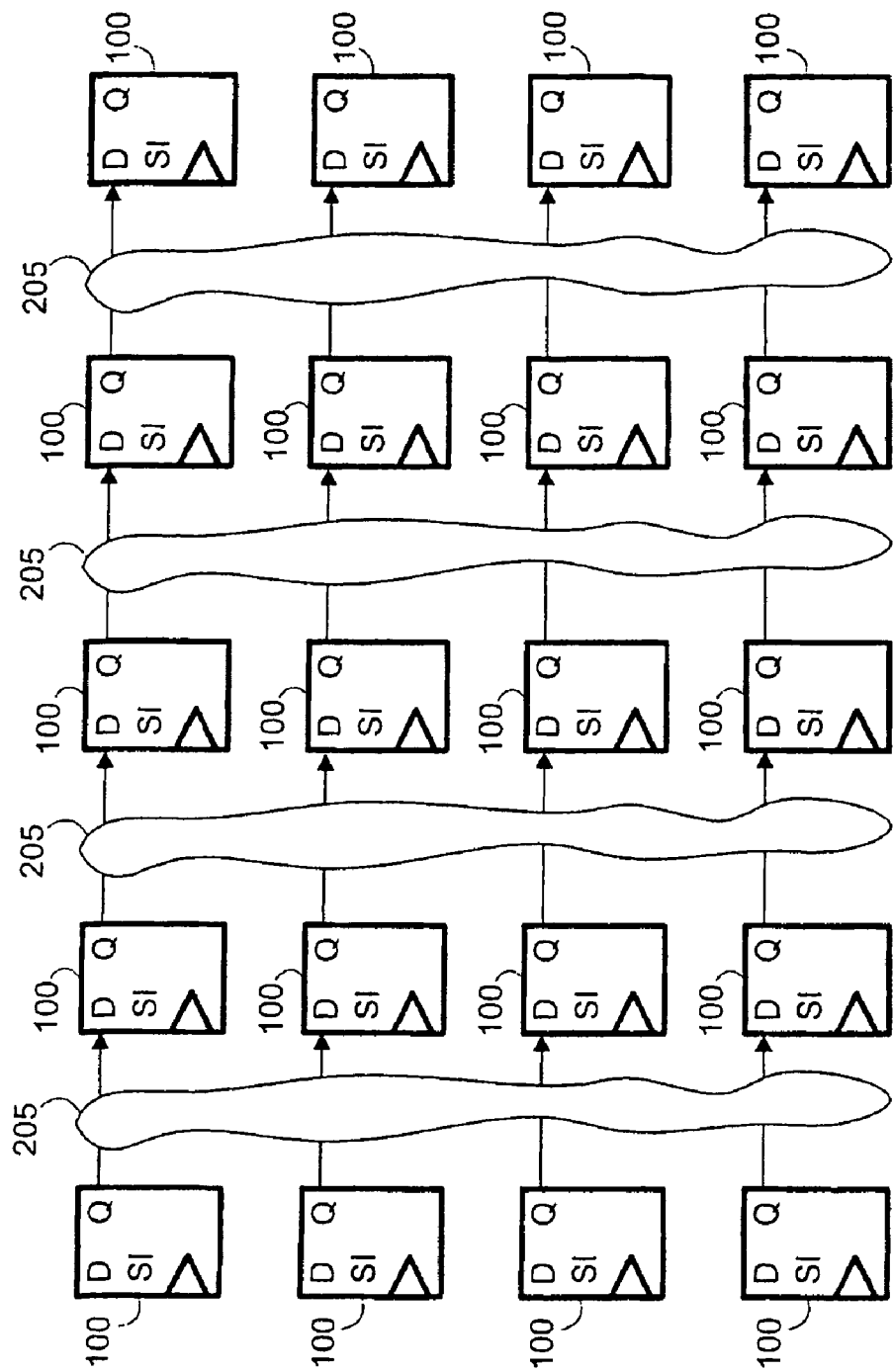
FIG. 2 is a simplified block diagram of typical scan flip-flops connected with combinatorial logic.

Typical register dominated integrated circuit designs contain many flip-flops, such as scan flip-flops 100. FIG. 2 shows an illustrative block diagram of multiple scan flip-flops 100 connected with combinatorial logic 205. Scan enable signal, SE, and clock signal, CLK, are not shown in FIG. 2 in order to avoid over complicating the drawing.

Figure 3A:
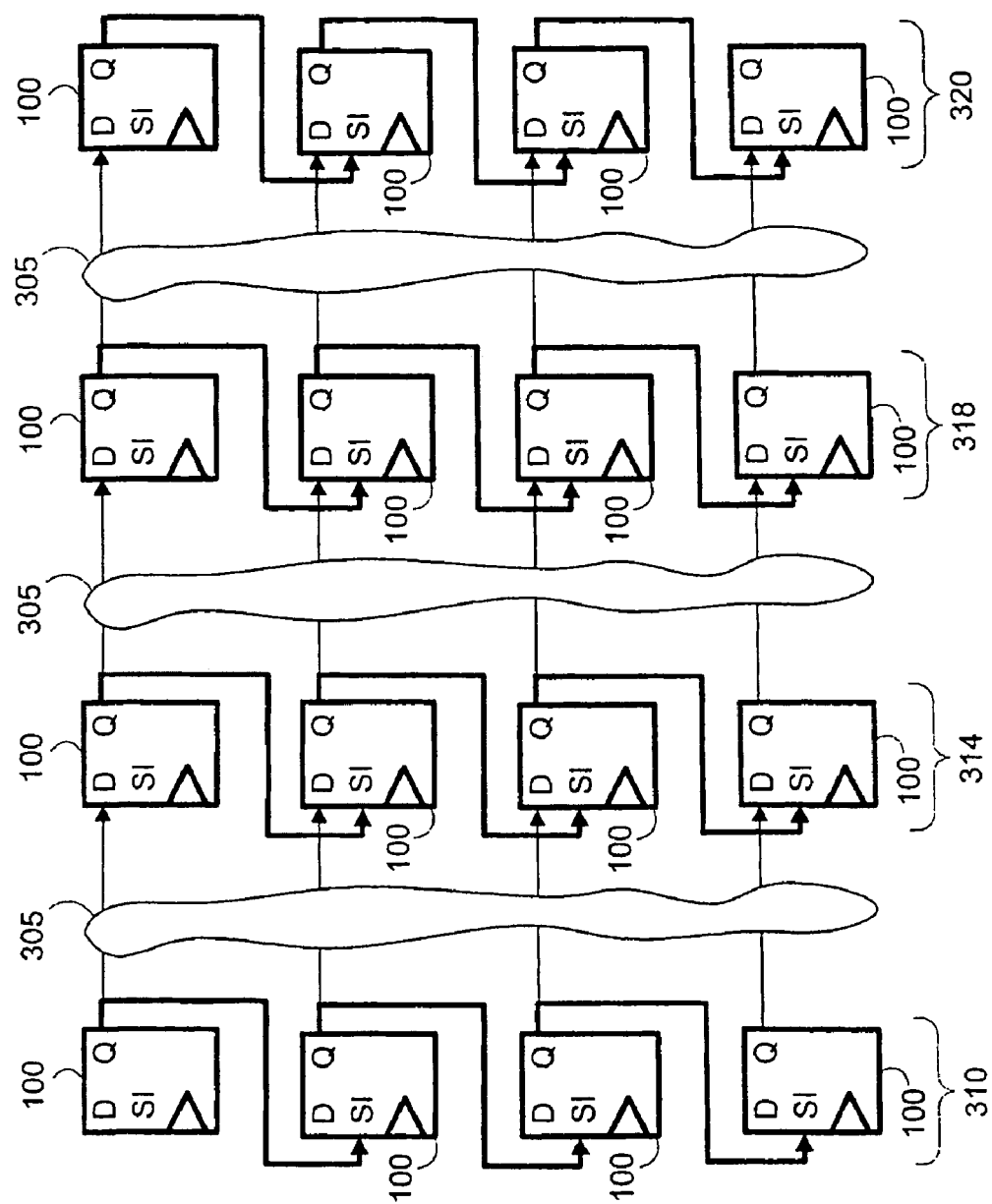
FIGS. 3A and 3B are simplified block diagrams of typical scan flip-flops connected in scan chain configurations.

FIG. 3A shows an illustrative block diagram of scan flip-flops 100 connected together to form a four scan chains 310, 314, 318, and 320. The interconnections of the scan chains are enabled by activating the scan enable, SE, inputs of scan flip-flops 100 (not shown).

Test waveforms or vectors are shifted into scan chains 310, 314, and 318. After the test vectors are fully loaded into the scan chains, scan enable, SE is deactivated. Then each of the test vectors propagates through combinatorial logic 305 to the input, D, of the next flip-flop 100 (i.e., the test vector loaded into scan chain 310 propagates through combinatorial logic 305 to the inputs of the flip-flops of scan chain 314). Then clock signal, CLK, is asserted once to capture the data into the flip-flops. After the data is captured, scan enable, SE, is activated again to form scan chains 310, 314, 318, and 320. Finally the data may be shifted out of scan chains 314, 318, and 320 as output vectors. The output vectors may then be analyzed to determine at least some of the functionality of one part or of the entire chip fabricated from the integrated circuit design.

Figure 3B:
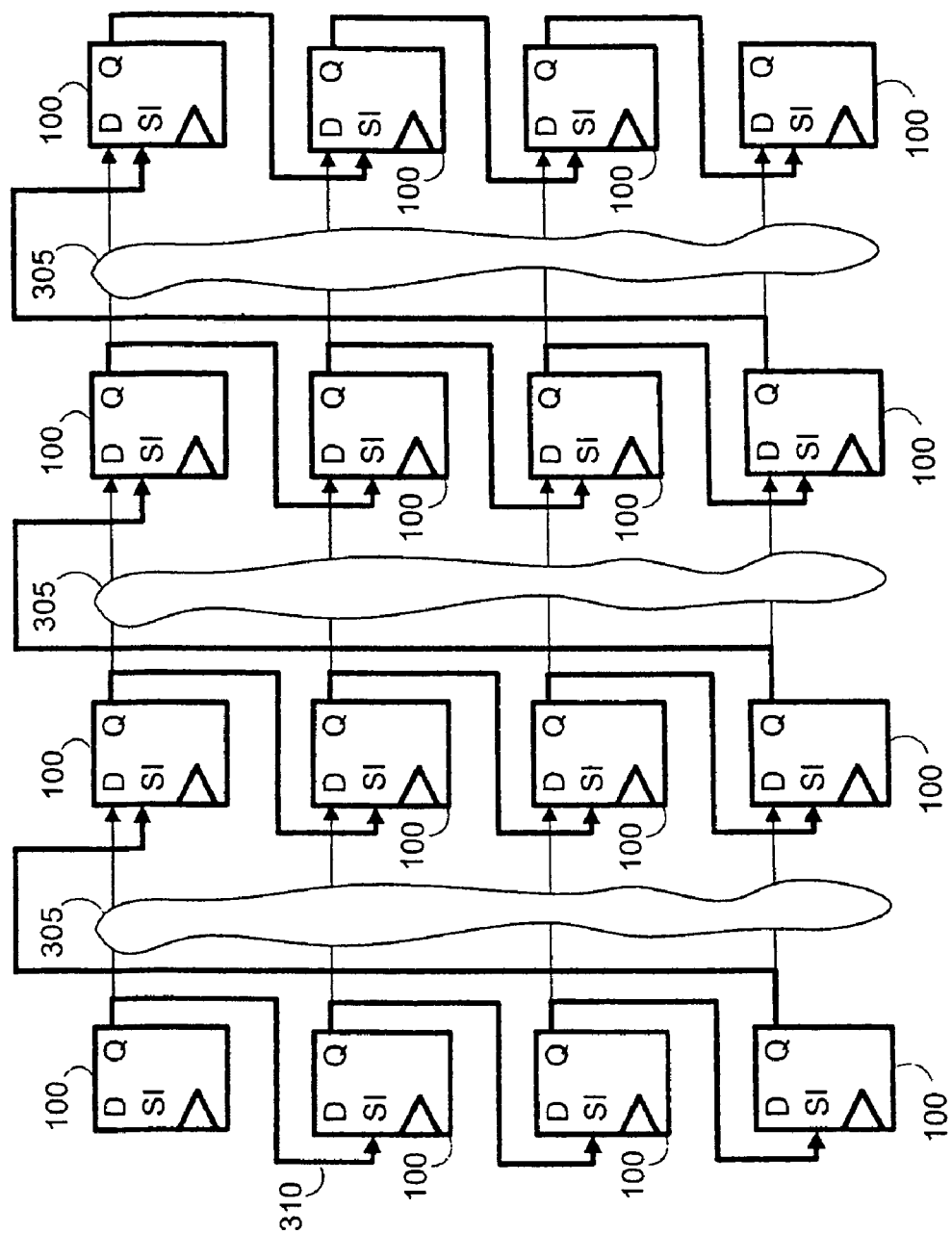

FIG. 3B shows another illustrative diagram of scan flip-flops 100 connected to form a scan chain. In this diagram, instead of four separate scan chains, all of the scan flip-flops are connected together to form a single scan chain 310. The operation of the scan chain test, however, remains the same. Instead of multiple test vectors loaded into multiple scan chains, a single test vector is shifted into the single scan chain 310. After the test vector is propagated through combinational logic 305 and loaded back into scan chain 310, a single output vector may be shifted out of scan chain 310. There are advantages to each of these scan chain test arrangements. The arrangement of FIG. 3B requires fewer inputs and outputs because only a single vector is shifted in and out of the scan chain. However, the arrangement of FIG. 3A provides faster testing because the multiple scan chains are shorter than the single scan chain of FIG. 3B.

FIGS. 3A and 3B show only two examples of the many ways scan flip-flops may be connected together to form scan chains, other scan chain arrangements may be possible in this circuitry.

The scan chain test may be used with an automatic test-pattern generation (ATPG) algorithm, which may automatically generate an input waveform or vector and analyze the scan chain test output to evaluate the circuit. The ATPG algorithm is an example of one type of design-for-test (DFT) technique, whereby elements of a circuit are designed specifically to facilitate testing of the circuit.

While typical scan flip-flops 100 are able to maintain stable outputs for a large range of operating frequencies and may also be connected as part of a scan chain, typical scan flip-flop 100 contains 28 transistors. Including the clock inverters necessary to produce an inverted clock signal, scan flip-flop 100 contains a total of 32 transistors. The large number of transistors in each scan flip-flop 100 occupies a large amount of area within the integrated circuit design and consumes a lot of power.

Figure 4:
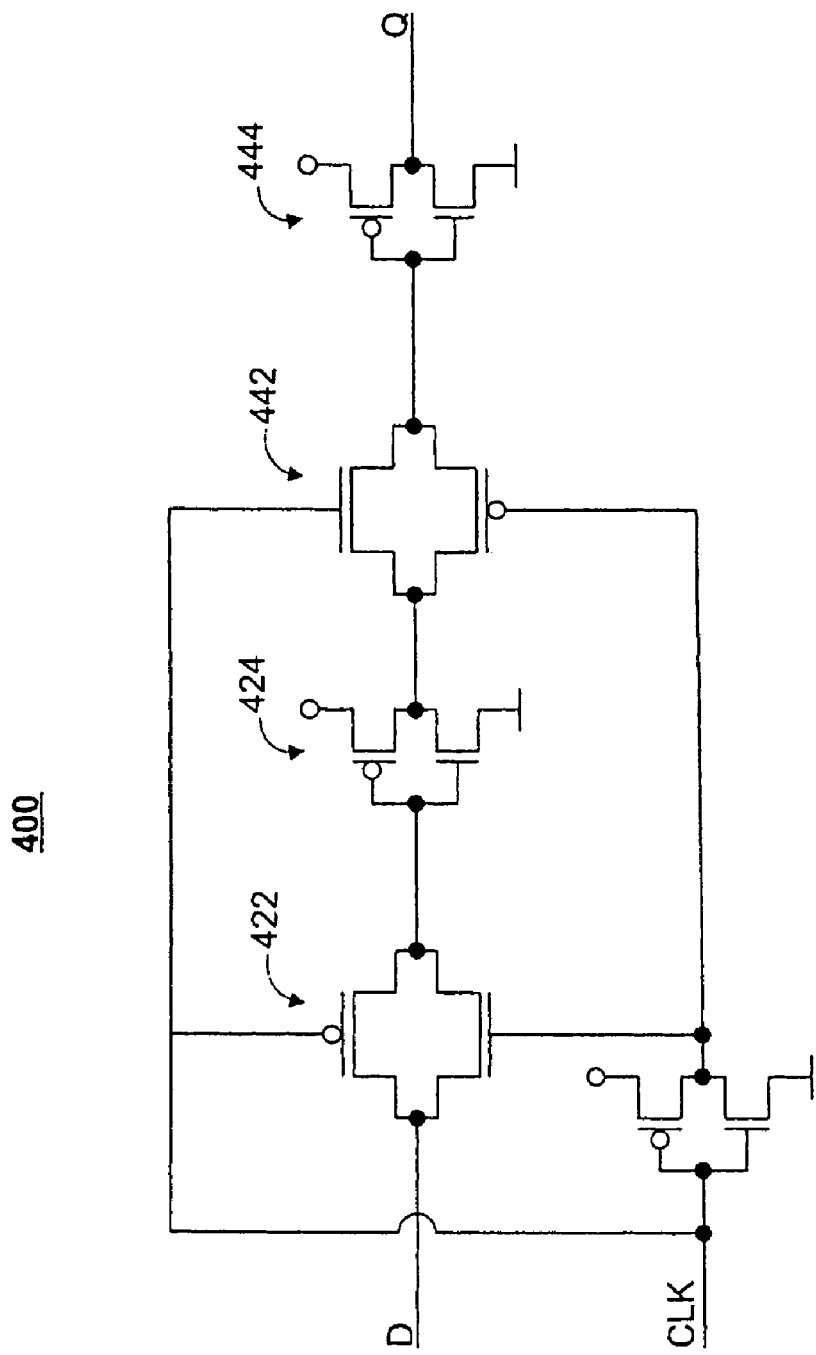
FIG. 4 is a simplified schematic of a typical transmission gate flip-flop.

FIG. 4 shows a simplified schematic of typical transmission gate flip-flop 400. Transmission gate flip-flop 400 is made up of two inverters 424 and 444 connected in a master-slave configuration. Unlike scan flip-flop 100, transmission gate flip-flop 400 does not have a multiplexer or feedback loops. Because transmission gate flip-flop 400 only has 10 transistors, transmission gate flip-flop 400 is more area optimized and consumes less power than scan flip-flop 100.

In transmission gate flip-flop 400, while clock signal CLK is in a LOW logic state, input signal D, is passed through passgate 422 to inverter 424. After clock signal CLK transitions to a HIGH logic state, passgate 422 cuts off the input to inverter 424 and passgate 442 passes the output of inverter 424 to inverter 444. Accordingly, the basic functionality of a rising-edge triggered flip-flop is achieved with transmission gate flip-flop 400 using a greatly reduced number of transistors.

However, while transmission gate flip-flop 400 provides the basic functionality of an edge triggered flip-flop, transmission gate flip-flop 400 has a few limitations. For example, transmission gate flip-flop 400 has a minimum clock signal frequency requirement. The logic states of inverters 424 and 444 are not maintained by a feedback loop. Therefore, unless the clock frequency is maintained at a frequency high enough to continuously refresh the values of inverters 424 and 444, the values stored in transmission gate flip-flop 400 may be lost.

The minimum frequency requirement of transmission gate flip-flop 400 also affects the ability of transmission gate flip-flop 400 to operate in a test mode, such as, for example, a scan test mode. Transmission gate flip flop 400 will not operate if clock signal CLK is turned off or operated at any frequency below the minimum frequency. Thus, transmission gate flip-flop 400 may not be usable to propagate test information, because the test information is often propagated through circuits at a low speed.

Figure 5:
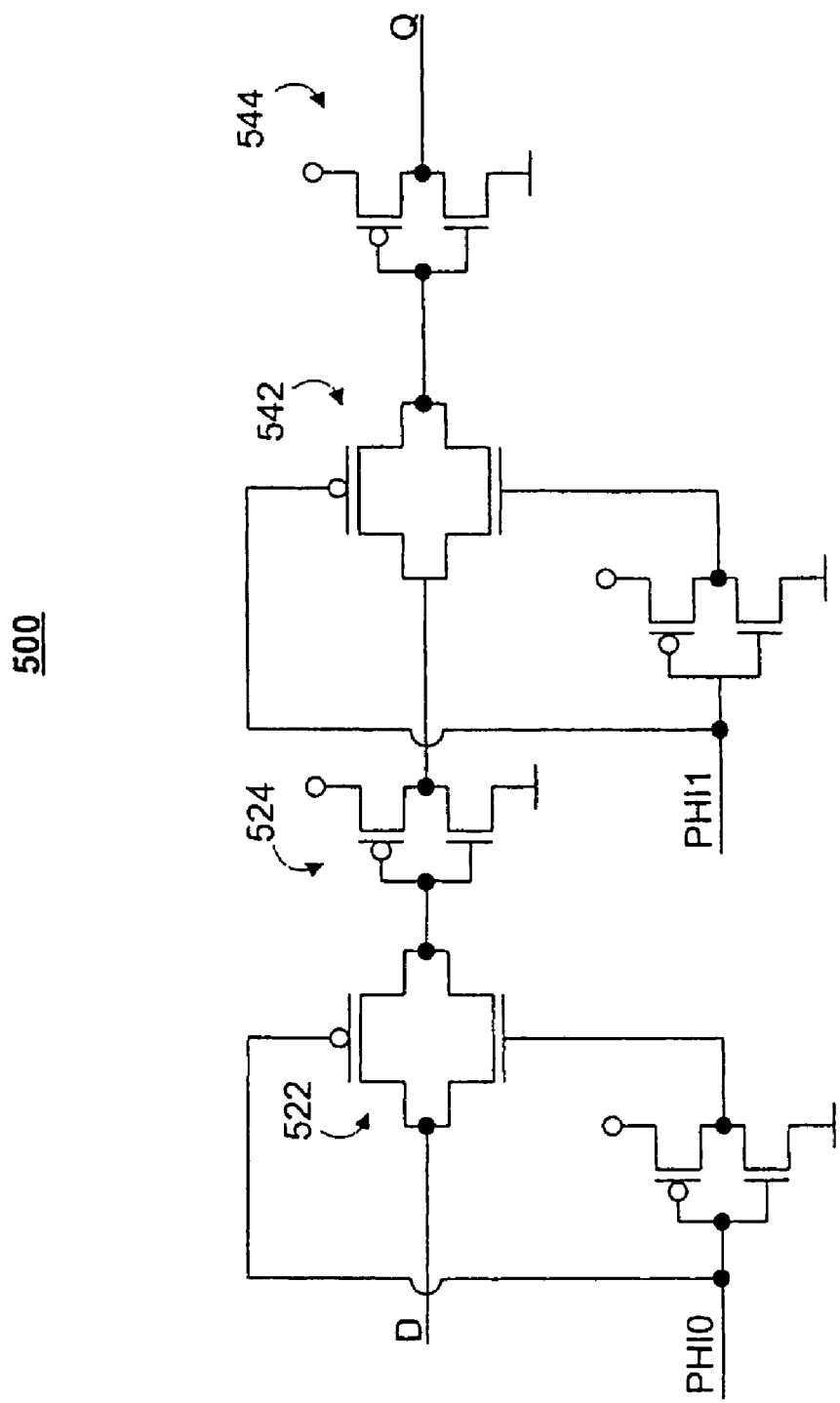
FIG. 5 is a simplified schematic of a typical non-overlapping clock phase transmission gate flip-flop.

FIG. 5 shows a simplified schematic of a second typical transmission gate flip-flop 500. Transmission gate flip-flop 500 includes a second non-overlapping clock signal. Rather than being edge-triggered as the previously described flip-flops, transmission gate flip-flop 500 operates like a level sensitive latch. Further, unlike transmission gate flip-flop 400, low frequency signals may be passed through transmission gate flip-flop 500.

In operational mode, when clock signal PHI0 is in a LOW logic state, input signal D is passed through passgate 522 to inverter 524. When clock signal PHI1 is in a LOW logic state, the output of inverter 524 is passed through passgate 542 to inverter 544. Thus, the input of transmission gate flip-flop 500 is propagated to the output of transmission gate flip-flop 500 after clock signals PHI0 and PHI1 are successively in a LOW logic state.

Transmission gate flip-flop 500, unlike transmission gate flip-flop 400, may be put into a bypass mode. When both clock signals PHI0 and PHI1 are held in a LOW logic state, low frequency signals may be passed through transmission gate flip-flop 500.

While transmission gate flip-flop 500 only has two additional transistors than transmission gate flip-flop 400, the non-overlapping clock signals introduce a significant amount of complexity to the design.

Figure 6:
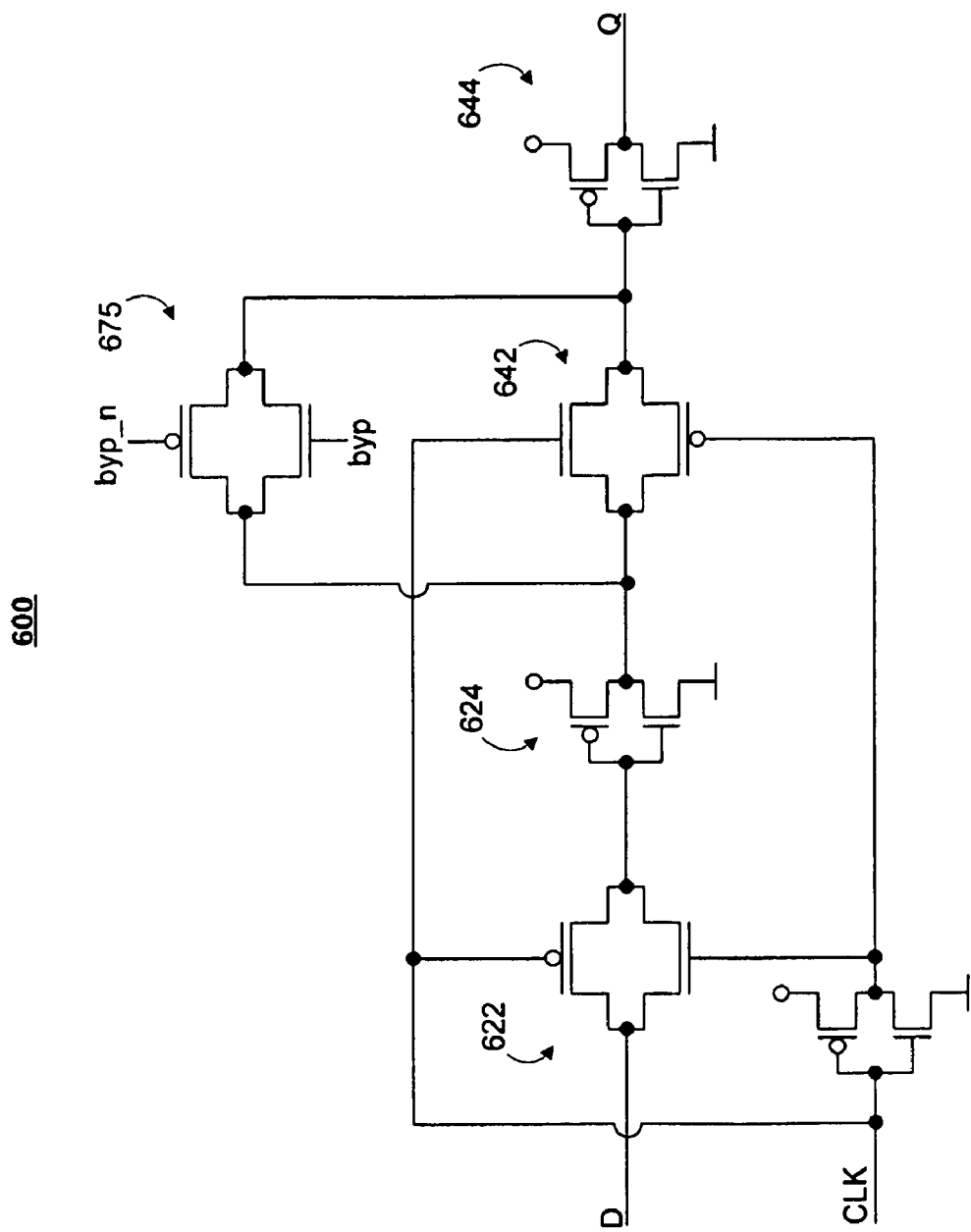
FIG. 6 is a simplified schematic of an area optimized bypass flip-flop in accordance with the invention.

FIG. 6 shows a simplified schematic of area optimized bypass flip-flop 600 in accordance with the invention. Like transmission gate flip-flop 400, while clock signal, CLK, is in a LOW logic state, input signal, D, is passed through passgate 622 to inverter 624. After clock signal, CLK, transitions to a HIGH logic state, passgate 622 cuts off the input to inverter 624 and passgate 642 passes the output of inverter 624 to inverter 644.

Bypass flip-flop 600 has additional bypass passgate 675. When bypass passgate is cut off, bypass flip-flop 600 operates like transmission gate flip-flop 400. When bypass passgate 675 is turned on, and clock signal, CLK, is held in a LOW logic state, bypass flip-flop 600 is said to be in bypass mode and acts like a buffer instead of a flip-flop.

The design of bypass flip-flop 600 is an improvement over transmission gate flip-flops 400 and 500. Bypass flip-flop 600 has a bypass mode, which allows signals to pass through the flip-flop, while still maintaining the simplicity of having a single clock input.

Bypass flip-flops 600 may be used in conjunction with a scan test mode. During the scan test mode, the clock signal, CLK, is switched to a LOW logic state and bypass passgate 675 is turned on, putting bypass flip-flop 600 in bypass mode. Bypass flip-flop 600, in bypass mode, allows the scan test information to propagate because bypass flip flop 600 behaves like a buffer and can propagate low speed test information in spite of any minimum frequency requirements.

Bypass flip-flop 600, in accordance with the invention, can be used to replace some instances of scan flip-flop 100 in an integrated circuit design. Bypass flip-flop 600 can function like a typical flip-flop or bypass flip-flop 600 can function like a buffer to facilitate a scan test mode. While in the scan test mode bypass flip-flops 600 are put into bypass mode in order to pass scan test information. Bypass flip-flop 600 is smaller and consumes less power than typical scan flip-flops 100, because it only has 12 transistors instead of 32 transistors.

Like transmission gate flip-flop 400, bypass flip-flop 600 has a minimum frequency requirement when operating as a flip-flop. If clock signal CLK for bypass flip-flop 600 falls below a certain frequency, leakage currents may discharge bypass flip-flop 600 between clock cycles.

While bypass flip-flop 600 can pass test information like a buffer to allow testing of a chip fabricated from a design, it cannot provide all of the testability of a scan flip-flop 100. For example, bypass flip-flop 600 may contain an undetectable "stuck-at" fault. A "stuck-at" fault may be caused by a flaw in the fabrication process. A "stuck-at" fault occurs when a node is stuck at a fixed voltage. For example, in bypass mode passgate 642 should be turned-off. However, the state of passgate 642 cannot be determined during a scan chain test because signals will be transmitted from the output of inverter 624 to inverter 644 irrespective of the state of passgate 642. Thus, the state of passgate 642 and the presence of a "stuck-at" fault at that node cannot be detected in bypass mode. In spite of this, the functionality of passgate 642 may still be determinable using other tests, such as a functional test, when bypass flip-flop 600 is not in bypass mode. In spite of this limitation, bypass flip-flop 600 provides many advantages over other flip-flop designs.

Figure 7:
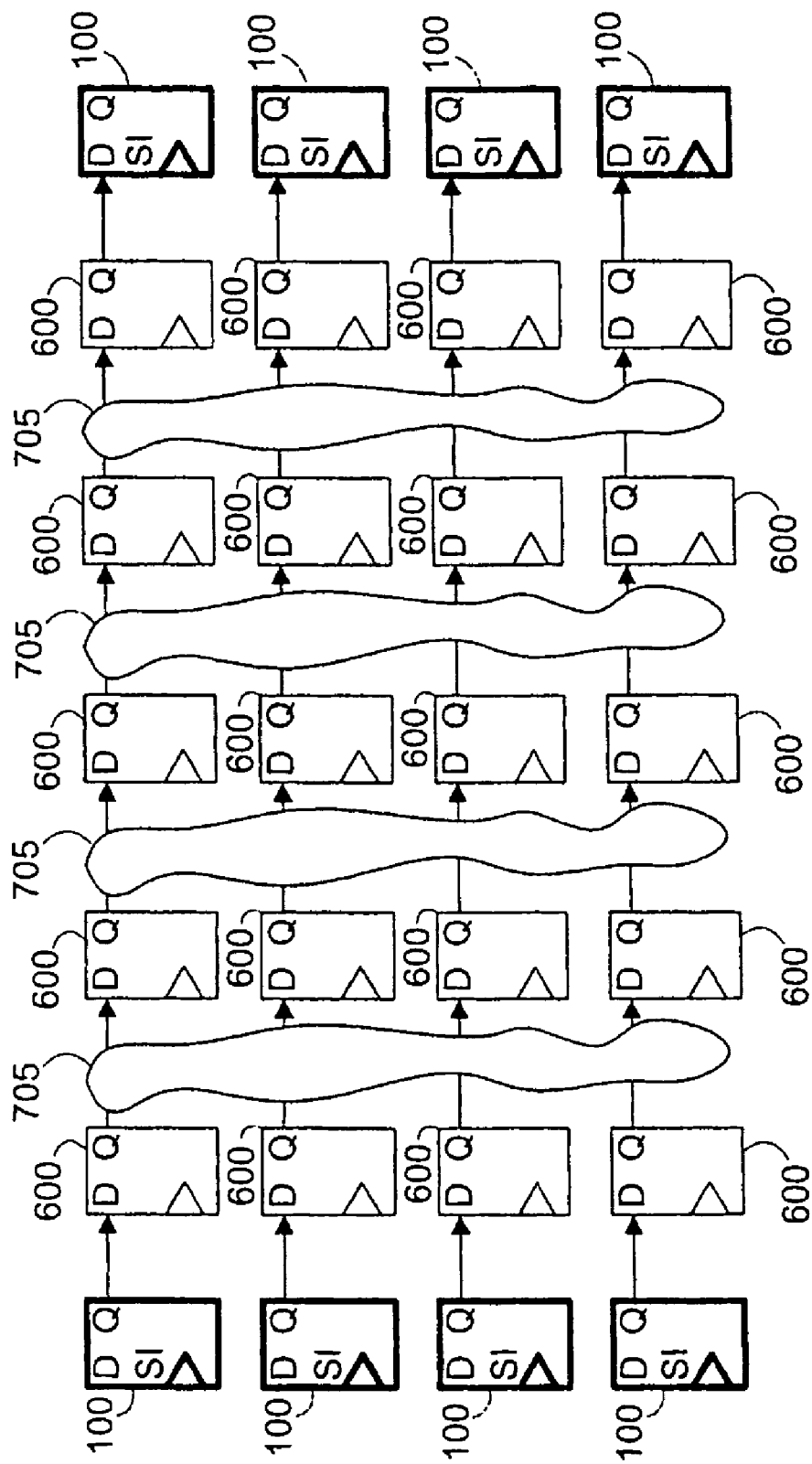
FIG. 7 is a simplified block diagram of flip-flops connected with combinatorial logic, including area optimized bypass flip-flops in accordance with the invention.
Figure 8:
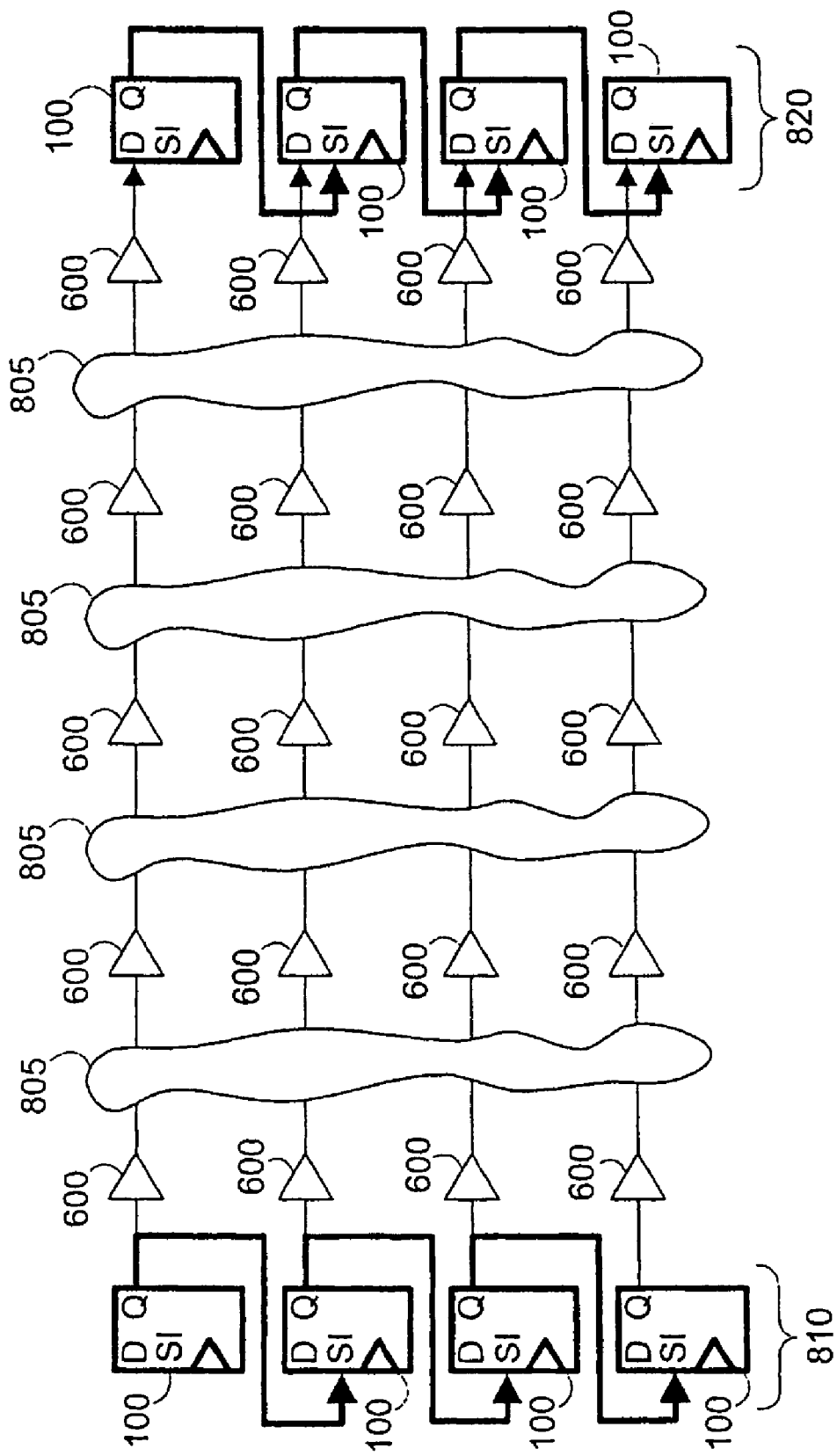
FIG. 8 is a simplified block diagram of flip-flops connected with combinatorial logic, including area optimized bypass flip-flops, in bypass mode, in accordance with the invention.

FIG. 7 and FIG. 8 show simplified block diagrams of a scan test mode using scan flip-flops 100 and bypass flip-flops 600 in accordance with the invention. FIG. 7 shows a simplified block diagram of scan flip-flops 100 and bypass flip-flops 600 connected with combinatorial logic. According to other embodiments of the present invention, any other suitable combination of combinatorial logic, bypass flip-flops 600, scan flip-flops 100, and other flip-flops may be used within a particular design. In the present embodiment, bypass flip-flops 600 are not in bypass mode, and thus bypass flip-flops 600 may propagate data signals like typical scan flip-flops 100.

FIG. 8 shows a simplified block diagram of the arrangement of FIG. 7 during a scan test mode. During the scan test, bypass flip-flops 600 are put in bypass mode. Bypass flip-flops 600 are represented in FIG. 8 as buffers to indicate the behavior of bypass flip-flops 600 when they are put in bypass mode. Two scan chains 810 and 820 are formed from scan flip-flops 100. After a test vector is shifted into scan chain 810, the test information is propagated through the multiple stages of bypass flip-flops 600, in bypass mode, and through the multiple stage of combinatorial logic 805 to the scan flip-flops 100 of scan chain 820. The output of the scan test may then be shifted out of scan chain 820. Thus, it can be seen that the combination of scan flip-flops 100 and bypass flip-flops 600 of FIG. 8 allows a test vector to be shifted into and out of a circuits in a similar manner as the full scan chain of FIG. 3A. In accordance with the arrangement of FIG. 3B, scan chains 810 and 820 may be combined to form a single scan chain. Other scan chain arrangements are also possible in accordance with the invention.

Bypass flip-flops 600 of FIG. 8 take up less area than the scan flip-flops 100 of FIG. 3, reducing the total area of the design illustrated in FIG. 8.

According to the preferred embodiment of the present invention bypass flip-flops 600 and scan flip-flops 100 are connected to separate clock signals. This allows one clock signal to propagate the test vector through the scan flip-flops 100, while the clock signal connected to the bypass flip-flops 600 is held LOW, so that bypass flip-flops 600 remain on.

According to another embodiment of the present invention, bypass flip-flops 600 may be used to create short scan chains for improved testing efficiency and speed. For each design to be tested, the size of the test vector is normally based on the gate depth of that particular design. However, the time required to test each design is dependent on the amount of time required to shift the test vector through the entire scan chain, regardless of the size of the test vector. Accordingly, by using bypass flip-flops 600 as buffers, the length of the scan chains can be reduced or varied. Thus, by reducing the length of the scan chain, the time and expense of circuit testing may be reduced.

Thus it is seen that an area optimized edge-triggered flip-flop for high-speed memory dominated design is provided. One skilled in the art will appreciate that the invention can be practiced by other than the described embodiments, which are presented for purposes of illustration and not of limitation, and the present invention is limited only by the claims which follow.

The invention claimed is:

1. Flip-flop circuitry comprising:
   first and second inverter circuits;
   first and second passgate circuits for respectively applying an input signal to the first inverter circuit and an output signal of the first inverter circuit to the second inverter circuit in response to respective first and second phases of a first control signal; and
   a third passgate circuit connected in parallel with the second passgate circuit and responsive to a second control signal, wherein the parallel combination comprising the second and third passgate circuits is connected in series between the first and second inverter circuits.

2. The circuitry defined in claim 1 wherein the first control signal is a clock signal.

3. The circuitry defined in claim 1 wherein each of the inverter circuits consists essentially of a pair of CMOS transistors.

4. The circuitry defined in claim 1 wherein each of the first and second passgate circuits consists essentially of a pair of CMOS transistors.

5. The circuitry defined in claim 1 wherein the third passgate circuit consists essentially of a pair of CMOS transistors.

6. The circuitry defined in claim 1 further comprising:
a third inverter circuit for receiving the first phase of the first control signal and for producing therefrom the second phase of the first control signal.

7. The circuitry defined in claim 6 wherein the third inverter circuit consists essentially of a pair of CMOS transistors.

8. The circuitry defined in claim 6 wherein the flip-flop circuitry consists essentially of the first, second, and third inverter circuits and the first, second, and third passgate circuits.

9. The circuitry defined in claim 1 wherein the sole circuitry connected between a data output terminal of the first passgate circuit and a data input terminal of the second passgate circuit is a pair of CMOS transistors forming the first inverter circuit.

10. The circuitry defined in claim 1 wherein the sole circuitry connected between a data output terminal of the second passgate circuit and a data output terminal of the flip-flop circuitry is a pair of CMOS transistors forming the second inverter circuit.

11. A plurality of flip-flop circuitries as defined in claim 1 connected in a series with one another.

12. The plurality of flip-flop circuitries connected in a series as defined in claim 11 further comprising a plurality of scan flip-flop circuitries connected within the series.

13. The plurality of flip-flop circuitries connected in a series as defined in claim 11 further comprising circuitry for applying the second control signal of at least one of the flip-flop circuits,
wherein said circuitry applying increases or decreases an amount of time it takes for a signal to propagate through the series of flip-flop circuitries.

14. The plurality of flip-flop circuitries connected in a series as defined in claim 11 further comprising a plurality of combinatorial logic circuitries connected within the series.

15. The plurality of flip-flop circuitries connected in a series as defined in claim 11 further comprising a scan chain connected to the said plurality of flip-flop circuitries.

16. Scan chain circuitry comprising:
a first and a second plurality of scan flip-flop circuitries connected together to form a first and a second scan chain; and
a plurality of bypass flip-flop circuitries connected together to form at least one serial chain, wherein the at least one serial chain is connected between one of the first plurality of scan flip-flop circuitries and one of the second plurality of scan flip-flop circuitries, wherein each of the plurality of bypass flip-flop circuitries comprises:
first and second inverter circuits,
first and second passgate circuits for respectively applying an input signal to the first inverter circuit and an output signal of the first inverter circuit to the second inverter circuit in response to respective first and second phases of a first control signal, and
a third passgate circuit connected in parallel with the second passgate circuit and responsive to a second control signal, wherein the parallel combination comprising the second and third passgate circuits is connected in series between the first and second inverter circuits.

17. The scan chain circuitry of claim 16 further comprising combinatorial logic circuitries connected within the at least one serial chain.

18. The scan chain circuitry of claim 16 wherein a test vector is shifted into the first scan chain.

19. The scan chain circuitry of claim 16 wherein an output vector is shifted out of the second scan chain.

20. The scan chain circuitry of claim 16 wherein the plurality of bypass flip-flop circuitries are in bypass mode.

21. Flip-flop apparatus comprising:
first passgate means for applying an input signal to a first means for inverting in response to a first phase of a first control signal;
second passgate means for applying the output of the first means for inverting to a second means for inverting in response to a second phase of the first control signal; and
third passgate means for applying connected in parallel with the second passgate means for applying and responsive to a second control signal, wherein the parallel combination comprising the second and third passgate means for applying is connected in series between the first and second means for inverting.

22. The apparatus defined in claim 21 wherein the first control signal is a clock signal.

23. The apparatus defined in claim 21 wherein each of the means for inverting consists essentially of a pair of CMOS transistors.

24. The apparatus defined in claim 21 wherein each of the first and second passgate means for applying consists essentially of a pair of CMOS transistors.

25. The apparatus defined in claim 21 wherein the third passgate means for applying consists essentially of a pair of CMOS transistors.

26. The apparatus defined in claim 21 further comprising:
third means for inverting for receiving the first phase of the first control signal and for producing therefrom the second phase of the first control signal.

27. The apparatus defined in claim 26 wherein the third means for inverting consists essentially of a pair of CMOS transistors.

28. The apparatus defined in claim 26 wherein the flip-flop apparatus consists essentially of the first, second, and third means for inverting and the first, second, and third passgate means for applying.

29. The apparatus defined in claim 21 wherein the sole circuitry connected between a data output terminal of the first passgate means for applying and a data input terminal of the second passgate means for applying is a pair of CMOS transistors forming the first means for inverting.

30. The apparatus defined in claim 21 wherein the sole circuitry connected between a data output terminal of the second passgate means for applying and a data output terminal of the flip-flop apparatus is a pair of CMOS transistors forming the second means for inverting.

31. A plurality of flip-flop apparatuses as defined in claim 21 connected in a series with one another.

32. The plurality of flip-flop apparatuses connected in a series as defined in claim 31 further comprising a plurality of scan flip-flop apparatuses connected within the series.

33. The plurality of flip-flop apparatuses connected in a series as defined in claim 31 further comprising means for applying the second control signal of at least one of the flip-flop circuits,
wherein said means for applying increases or decreases an amount of time it takes for a signal to propagate through the series of flip-flop apparatuses.

34. The plurality of flip-flop apparatuses connected in a series as defined in claim 31 further comprising a plurality of combinatorial logic apparatuses connected within the series of flip-flop apparatuses.

35. The plurality of flip-flop apparatuses connected in a series as defined in claim 31 further comprising a scan chain apparatus connected to said plurality of flip-flop apparatuses.

36. Scan chain apparatus comprising:
a first and a second plurality of scan flip-flop means connected together to form a first and a second scan chain means; and
a plurality of bypass flip-flop means connected together to form at least one serial chain means, wherein the at least one serial chain means is connected between one of the first plurality of scan flip-flop means and one of the second plurality of scan flip-flop means, wherein each of the plurality of bypass flip-flop means comprises:
first passgate means for applying an input signal to a first means for inverting in response to a first phase of a first control signal,
second passgate means for applying the output of the first means for inverting to a second means for inverting in response to a second phase of the first control signal, and
third passgate means for applying connected in parallel with the second passgate means for applying and responsive to a second control signal, wherein the parallel combination comprising the second and third passgate means for applying is connected in series between the first and second means for inverting.

37. The scan chain apparatus of claim 36 further comprising combinatorial logic means connected within the at least one serial chain means.

38. The scan chain apparatus of claim 36 wherein a test vector means is shifted into the first scan chain means.

39. The scan chain apparatus of claim 36 wherein an output vector means is shifted out of the second scan chain means.

40. The scan chain apparatus of claim 36 wherein the plurality of bypass flip-flop means are in bypass mode.

41. A method of flip-flop circuit operation comprising:
applying with first passgate circuitry an input signal to a first inverter in response to a first phase of a first control signal;
using the first inverter to invert the input signal to produce a first inverter output signal;
further applying with second passgate circuitry the first inverter output signal to a second inverter in response to a second phase of the first control signal;
alternatively applying with third passgate circuitry the first inverter output signal to the second inverter in response to a second control signal; and
using the second inverter to invert the first inverter output signal as applied to the second inverter by the further applying or the alternatively applying.

42. The method of claim 41 wherein the first control signal is a clock signal.

43. The method of claim 41 wherein each of the inverters consists essentially of a pair of CMOS transistors.

44. The method of claim 41 wherein the first passgate circuitry consists essentially of a pair of CMOS transistors.

45. The method of claim 41 wherein the second passgate circuitry consists essentially of a pair of CMOS transistors.

46. The method of claim 41 wherein the third passgate circuitry consists essentially of a pair of CMOS transistors.

47. The method of claim 41 further comprising:
receiving the first phase of the first control signal with a third inverter; and
using the third inverter to invert the received first phase of the first control signal to produce therefrom the second phase of the first control signal.

48. The method of claim 47 wherein the third inverter consists essentially of a pair of CMOS transistors.

49. A method of scan chain operation comprising:
connecting a first and a second plurality of scan flip-flop circuitries together to form a first and a second scan chain;
connecting a plurality of bypass flip-flop circuitries together to form at least one serial chain; and
connecting the at least one serial chain between one of the first plurality of scan flip-flop circuitries and one of the second plurality of scan flip-flop circuitries, wherein the operation of each of the plurality of bypass flip-flop circuitries comprises:
applying with first passgate circuitry an input signal to a first inverter in response to a first phase of a first control signal,
using the first inverter to invert the input signal to produce a first inverter output signal,
further applying with second passgate circuitry the first inverter output signal to a second inverter in response to a second phase of the first control signal,
alternatively applying with third passgate circuitry the first inverter output signal to the second inverter in response to a second control signal, and
using the second inverter to invert the first inverter output signal as applied to the second inverter by the further applying or the alternatively applying.

50. The method of claim 49 further comprising connecting combinatorial logic circuitries within the at least one serial chain.

51. The method of claim 49 further comprising shifting a test vector into the first scan chain.

52. The method of claim 49 further comprising shifting an output vector out of the second scan chain.

53. The method of claim 49 further comprising putting the plurality of bypass flip-flop circuitries into bypass mode.

* * * * *